(12) United States Patent
Ito et al.

(10) Patent No.: US 8,283,051 B2
(45) Date of Patent: *Oct. 9, 2012

(54) PLATED PRODUCT HAVING COPPER THIN FILM FORMED THEREON BY ELECTROLESS PLATING

(75) Inventors: Junichi Ito, Kitaibaraki (JP); Atsushi Yabe, Kitaibaraki (JP); Junnosuke Sekiguchi, Kitaibaraki (JP); Toru Imori, Kitaibaraki (JP); Yasuhiro Yamakoshi, Kitaibaraki (JP); Shinichiro Senda, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/737,399

(22) PCT Filed: Jul. 13, 2009

(86) PCT No.: PCT/JP2009/062662
§ 371 (c)(1),
(2), (4) Date: Jan. 7, 2011

(87) PCT Pub. No.: WO2010/016358
PCT Pub. Date: Feb. 11, 2010

(65) Prior Publication Data
US 2011/0129688 A1    Jun. 2, 2011

(30) Foreign Application Priority Data
Aug. 7, 2008  (JP) ................................ 2008-203930

(51) Int. Cl.
B32B 15/08    (2006.01)
(52) U.S. Cl. ........ 428/665; 428/606; 428/607; 428/615; 428/626; 428/663; 428/667
(58) Field of Classification Search .................. 428/209; 257/758
See application file for complete search history.

(56) References Cited

U.S. PATENT DOCUMENTS

| 4,080,513 | A | * | 3/1978 | Cuneo et al. | 174/255 |
| 5,882,498 | A | * | 3/1999 | Dubin et al. | 205/261 |
| 6,416,812 | B1 | | 7/2002 | Andricacos et al. | |
| 6,680,540 | B2 | * | 1/2004 | Nakano et al. | 257/758 |

FOREIGN PATENT DOCUMENTS

| JP | 2002-275639 A | 9/2002 |
| JP | 2002-302773 A | 10/2002 |
| JP | 2008-223100 A | 9/2008 |
| WO | WO 2005/038086 A1 | 4/2005 |

OTHER PUBLICATIONS

European Search Report dated Aug. 19, 2011 for corresponding European Application No. 09804845.7.
Yu-Hsien Chou et al., "Effects of Molybdate Concentration on the Characteristics of Mi-Mo-P Diffusion Barriers Grown by Nonisothermal Electroless Deposition", Journal of the Electrochemical Society, Jul. 8, 2008, pp. D551-D557.
Hila Einati et al., "The effect of tungsten and boron on the Cu barrier and oxidation properties of thin electroless cobalt-tungsten-boron films", Microelectronic Engineering, Aug. 29, 2005, pp. 623-628.
Young-soon Kim, et al., "Direct Copper Electroless Deposition on a Tungsten Barrier Layer for Ultralarge Scale Integration", Journal of the Electrochemical Society, Jan. 11, 2005, pp. C89-C95.

* cited by examiner

*Primary Examiner* — Cathy Lam
(74) *Attorney, Agent, or Firm* — Flynn, Thiel, Boutell & Tanis, P.C.

(57) ABSTRACT

A plated product made of a substrate having formed thereon an alloy barrier thin film for preventing copper diffusion contains metal B, which has barrier properties in relation to copper and enables displacement plating with the copper ions contained in an electroless copper plating solution, and metal A, which tends to have less ionization than metal B in an electroless copper plating solution at a pH of 10 or higher; the alloy barrier thin film for preventing copper diffusion has a composition wherein metal A constitutes between 15 and 35 at % of the atoms; and a copper thin film is formed on the alloy barrier thin film by electroless plating using an electroless copper plating solution at a pH of 10 or higher.

5 Claims, No Drawings

PLATED PRODUCT HAVING COPPER THIN FILM FORMED THEREON BY ELECTROLESS PLATING

BACKGROUND OF THE INVENTION

1. Field of the Invention

The present invention relates to a plated product having a copper thin film formed thereon by electroless plating, and more particularly to a plated product having a copper thin film formed thereon by electroless plating that serves as a seed layer for forming ULSI ultrafine copper wiring (damascene copper wiring).

2. Description of the Related Art

As a method for deposition of a copper film for ULSI ultrafine copper wiring (damascene copper wiring), electroless copper plating is expected to replace the current sputtering and electrolytic copper plating methods.

When electroless copper plating was performed on a semiconductor wafer or other mirrored surface in the past, it was difficult to acquire sufficient adherence of the deposited plating film. In addition, the plating had low reactivity, and uniform plating over the entire surface of the substrate was difficult to obtain. Conventionally, for example, when a copper seed layer was formed by electroless plating on a layer of a barrier metal such as tantalum nitride, there was a problem because it was difficult to form the plating layer uniformly, and the adherence thereof was insufficient. Moreover, also when forming a copper seed layer by electroless plating on a barrier metal layer of an elemental metal such as tungsten or molybdenum, there was still a problem because it was difficult to form the plating layer uniformly, and the adherence thereof was insufficient. Therefore, a catalyst-imparting step prior to electroless plating was required in order to form a uniform copper seed layer on a barrier layer of tantalum nitride and the like.

The present inventors had already discovered that by adding a water-soluble, nitrogen-containing polymer with a low weight-average molecular weight (Mw) as an additive to the electroless copper plating solution, and by attaching a catalyst metal to the substrate of the object to be plated or by forming a catalyst metal as a film on the outermost surface of the object to be plated before immersion in the plating solution, and then immersing the object to be plated in the plating solution to adsorb the polymer into the catalyst metal via the nitrogen atoms, the plating deposition rate was controlled, and the crystals were dramatically micronized, thus enabling the formation of a uniform thin film with a thickness of 15 nm or less on a mirrored surface such as that of a wafer (Japanese Patent Publication No. 2008-223100). Moreover, in the examples of that invention the inventors demonstrated that by first forming a film of catalyst metal on the outermost surface of the object to be plated and then immersing the object to be plated in the plating solution to adsorb the polymer into the catalyst metal via the nitrogen atoms, the plating deposition rate was controlled, and the crystals were dramatically micronized, thus enabling the formation of a uniform thin film with a thickness of 6 nm or less on a mirrored surface such as that of a wafer.

In such a method, i.e., a method of providing a copper seed layer for the formation of damascene copper wiring by electroless plating after forming a catalyst metal film, a barrier layer to prevent copper diffusion must be formed on the substrate prior to and separately from the catalyst layer. This means that a bilayer consisting of the barrier layer and the catalyst metal layer must be formed prior to the formation of the copper seed layer. Thus, it became clear that application of this method to the actual step of fabricating ultrafine wiring wherein the film thickness cannot be increased will be very difficult.

SUMMARY OF THE INVENTION

An object of the present invention is to provide a plated object having a thin seed layer of uniform thickness that enables the fabrication of ultrafine wiring thereon in which, when the seed layer is formed by electroless copper plating, the uniformity and adherence thereof are improved over the aforementioned case in which electroless copper plating is performed on an elemental metal such as tungsten, molybdenum, etc., and the aforementioned complexity of forming two layers before forming the copper seed layer is eliminated.

As a result of diligent research the inventors discovered that if an alloy thin film is formed comprising metal B, which has barrier properties in relation to copper and enables displacement plating with the copper ions contained in an electroless copper plating solution, and metal A, which tends to have less ionization than metal B in an electroless copper plating solution at pH 10 or higher, and then electroless copper plating is performed thereon using an electroless copper plating solution at a pH of 10 or higher, the uniformity and adherence are improved over the aforementioned case in which electroless copper plating is performed on an elemental metal such as tungsten, molybdenum, etc., and the aforementioned complexity of forming two layers before forming the copper seed layer is eliminated, thus completing the present invention.

More specifically, the present invention is as follows:

(1) A plated product comprising a substrate having formed thereon an alloy barrier thin film for preventing copper diffusion comprising metal B, which has barrier properties in relation to copper and enables displacement plating with the copper ions contained in an electroless copper plating solution, and metal A, which tends to have less ionization than metal B in an electroless copper plating solution at pH 10 or higher; the alloy barrier thin film for preventing copper diffusion has a composition wherein metal A constitutes between 15 and 35 at % of the atoms; and a copper thin film is formed on the alloy barrier thin film by electroless plating using an electroless copper plating solution at pH 10 or higher;

(2) The plated product as in (1) above wherein metal B is tungsten or molybdenum and metal A is at least one metal selected from a group consisting of nickel, cobalt, and tin; and (3) The plated product as in (1) or (2) above wherein the copper thin film formed by electroless plating is 10 nm or less in thickness and has a resistivity of 10 μΩ·cm or less.

(4) The plated product according to any of (1) through (3) above wherein the alloy barrier thin film for preventing copper diffusion is formed by sputtering.

In accordance with the present invention, an alloy barrier thin film for preventing copper diffusion with the specified composition of metal B, which has barrier properties in relation to copper and enables displacement plating with the copper ions contained in an electroless copper plating solution, and metal A, which tends to have less ionization than metal B in an electroless copper plating solution at a pH of 10 or higher, can be formed on a substrate. By forming the alloy thin film on the substrate by electroless copper plating using an electroless copper plating solution at a pH of 10 or higher, the uniformity and adherence of the formed alloy thin film can be improved over a case in which electroless copper plating is performed on an elemental metal such as tungsten, molybdenum, etc. In addition, it is possible to create a substantially oxygen-free state at the interface between the alloy barrier thin film for preventing copper diffusion and the electroless copper plated layer formed thereon, which lowers the resistance of the copper thin film.

Moreover, the above alloy thin film enables the formation of a copper seed layer with excellent film uniformity and adherence by electroless copper plating without providing a catalytic metal layer thereon, so when forming damascene copper wiring, the complexity of forming a bilayer consisting of a barrier layer and catalyst metal layer can be eliminated, thereby enabling the thin film to be made even thinner.

DETAILED DESCRIPTION OF THE PREFERRED EMBODIMENTS

The present invention relates to a plated product comprising a substrate having formed thereon an alloy barrier thin film for preventing copper diffusion comprising metal B, which has barrier properties in relation to copper and enables displacement plating with the copper ions contained in an electroless copper plating solution, and metal A, which tends to have less ionization than metal B in an electroless copper plating solution at a pH of 10 or higher, and having a copper thin film formed on the alloy barrier thin film by electroless plating using an electroless copper plating solution at a pH of 10 or higher.

Metal B, which has barrier properties in relation to copper and enables displacement plating with the copper ions contained in an electroless copper plating solution, includes tungsten and molybdenum. Either metal can be used, but tungsten is preferred.

When tungsten or molybdenum is used as metal B, examples of metal A, which tends to have less ionization than tungsten or molybdenum in an electroless copper plating solution at a pH of 10 or higher, include nickel, cobalt, tin, magnesium, aluminum, zinc, etc. Nickel, cobalt, and tin are preferred, and nickel and cobalt are even more preferred. Because nickel and cobalt have a relatively high melting point, they can be alloyed with tungsten and molybdenum in the form of powdered starting materials, and they are also useful as gate electrode materials.

When electroless copper plating is performed on an elemental metal such as tungsten, molybdenum, etc., first displacement plating occurs between the copper and the tungsten or molybdenum, and because the initiation of displacement is nonuniform, a reduction reaction proceeds on top of the copper deposited by displacement before the displacement reaction occurs over the entire surface, and a reduced plating film covers the parts at which displacement plating has not yet occurred. It is believed that when a reduced plating film is formed on parts where the displacement reaction has not yet occurred, the adherence becomes poorer because gaps remain therebetween. When an alloy thin film consisting of metal A and metal B is used, displacement plating between metal B and the copper occurs more readily as a result of performing electroless copper plating thereon using an electroless copper plating solution at a pH of 10 or higher. Furthermore, because metal B has an ionization tendency higher than that of metal A, localized galvanic corrosion occurs, metal B dissolves, and the displacement reaction proceeds under that effect, which results in fewer parts where the displacement reaction does not occur. For these reasons, it is thought that both the adherence and film uniformity are increased.

In the composition of the alloy barrier thin film for preventing copper diffusion that comprises metal B, which has barrier properties in relation to copper and enables displacement plating with the copper ions contained in an electroless copper plating solution, and metal A, which tends to have less ionization than metal B in an electroless copper plating solution at a pH of 10 or higher, preferably the ratio of metal A is between 15 and 35 at %, and more preferably 25 at % or less. If the ratio of metal A dips below 15 at %, there will be more places where the displacement reaction does not occur as disclosed above, and the deposition of copper will be nonuniform, thereby decreasing the adherence of the copper film. If the ratio is greater than 35 at %, metal A will diffuse into the copper film, thereby increasing the resistance.

The alloy thin film can be formed by a publicly known method for forming a thin film, and forming the same by sputtering onto the substrate using a sputtering alloy target containing metal A and metal B is preferred. An alloy thin film of the above composition can be formed with a sputtering target containing metal A and metal B with approximately the same composition as the desired alloy thin film composition.

The thickness of the alloy thin film is preferably 3 to 20 nm, and more preferably 5 to 15 nm.

A semiconductor wafer is preferred as the substrate on which the alloy thin film is formed in the present invention, and by performing an acid treatment, alkali treatment, surfactant treatment, ultrasonic cleaning or a combination thereof, one can accomplish cleaning of the substrate and improvement of wettability.

The copper thin film formed by electroless copper plating is formed as mainly a displacement reaction between the copper ions contained in the electroless copper plating solution and metal B and takes place at the initial stage, thereby metal deposits from the copper ions contained in the electroless copper plating solution.

Because the copper thin film is formed by displacement plating in the initial reaction, oxides on the surface of the alloy thin film are removed in the process of displacement plating. By the above action, it is possible to limit the oxygen concentration at the interface between the alloy thin film and the copper thin film to 1 at % or less (below the limit of detection) when analyzed by Auger electron spectroscopy (ABS). If oxygen is present at the interface, it can have such deleterious effects as increased resistance of the wiring, reduced barrier function, etc.

In addition, as a result, the thickness of the copper thin film can be 10 nm or less, and the resistivity 10 μΩ·cm or less. Reducing the film thickness of the seed layer enables an application for forming damascene copper wiring several tens of nanometers wide.

A conventional method can be used as the electroless copper plating method used when performing electroless copper plating using the alloy barrier thin film for preventing copper diffusion in the present invention. Similarly, a conventional electroless copper plating solution of a pH of 10 or higher can be used for the copper plating solution.

An electroless copper plating solution normally contains copper ions, a copper ion complexing agent, a reducing agent, a pH regulator, etc.

The use of glyoxylic acid as the reducing agent in the electroless copper plating solution is preferred in consideration of the adverse effects of formalin on the human body and the environment.

The concentration of glyoxylic acid in the plating solution is preferably 0.005 to 0.5 mol/L, and more preferably 0.01 to 0.2 mol/L. If the concentration is less than 0.005 mol/L, a plating reaction will not occur, and if the concentration exceeds 0.5 mol/L, the plating solution will become unstable and break down.

All generally used copper ion sources can be used as the copper ion source in the electroless copper plating solution of the present invention, and examples include copper sulfate, copper chloride, and copper nitrate. The concentration of the copper ion source in the electroless copper plating solution is preferably 0.005 to 0.1 mol/L. All generally used complexing agents can be used as the copper ion complexing agent, and examples include ethylene diammonium tetraacetate, and tartaric acid. The concentration of the complexing agent in the electroless copper plating solution is preferably 0.02 to 0.5 mol/L.

Additives generally used in a plating solution can be used as additional additives, and examples include 2,2'-bipyridyl, polyethylene glycol, and potassium ferrocyanide.

In addition, in the present invention, use of an electroless copper plating solution at a pH of 10 to 14 is preferred, and use at a pH of 12 to 13 is more preferred. A generally used pH regulator such as sodium hydroxide or potassium hydroxide can be used as the pH regulator, but when alkali metals such as sodium and potassium are to be avoided for semiconductor use, tetramethylammonium hydroxide can be used.

The electroless copper plating solution of the present invention is used at a bath temperature of 40° C. to 90° C., and this is preferred from the standpoint of bath stability and copper deposition rate.

When plating is carried out using the electroless copper plating solution in the present invention, the object to be plated is immersed in a plating bath. The object to be plated has the aforementioned kind of alloy thin film formed thereon.

The thickness of the copper thin film fabricated by the electroless plating of the present invention is preferably 3 to 10 nm.

The copper thin film fabricated by the electroless plating process of the present invention is a thin coating with a uniform film thickness. Therefore, when used as a seed layer for damascene copper wiring, it can form a thin film seed layer of uniform thickness, even in very fine vias and trenches with a wire width of 100 nm or less and, as a result, a semiconductor wafer without defects such as voids, seams, etc., can be obtained.

The plated product of the present invention can additionally provide a wiring member by plating on top of the copper thin film formed by electroless plating. Electrolytic plating or electroless plating can be used for the plating method.

Copper or an alloy having copper as the main component thereof is preferred for the wiring member, and copper is even more preferred. The electrolytic copper plating solution can have a composition generally used for damascene copper wire embedding, and is not particularly limited herein. For example, a liquid containing copper sulfate and sulfuric acid as the main component and chlorine, polyethylene glycol, disodium bis(3-sulfopropyl)disulfide, Janus green, and the like as trace components can be used. In addition, the plating solution for embedding copper wiring disclosed in WO 2005/038086, for example, can be used as the electroless copper plating solution used for embedding.

The plated product of the present invention has the alloy thin film specified above formed on the substrate, and it has a copper thin film to function as a seed layer formed by electroless plating thereon. As already disclosed, by using the alloy thin film specified above, it is possible to provide a copper seed layer thereon with excellent film uniformity and adherence by electroless copper plating and, as a result, it is possible to use a single layer having a barrier function whereon electroless plating can be performed, and the aformation of a bi-layer consisting of a catalyst metal layer and a barrier layer with a normal thickness of several tens of nanometers is unnecessary. Thus, in the plated product of the present invention, by utilizing the specified alloy thin film it is possible to use a single layer having a barrier function whereon electroless plating can be performed, and it is possible to make the thickness of the copper thin film serving as the seed layer 10 nm or less. Therefore, by performing metal plating with a conventional method on top of this copper thin film to serve as a wiring member, it is possible to produce a semiconductor element that can be used for damascene copper wiring several tens of nanometers wide. In addition, it is possible to make the resistivity of the copper thin film serving as the above seed layer 10 μΩ·cm or less, which facilitates producing a uniform film in the early stages of subsequent electroplating.

EXAMPLES

The present invention is described in greater detail by the following examples, but is by no means limited thereto.

Example 1

A 10 nm thick alloy thin film was fabricated on a semiconductor substrate using a sputtering alloy target comprising tungsten as metal B, which has barrier properties in relation to copper and enables displacement plating with the copper ions contained in an electroless copper plating solution, and nickel as metal A, which tends to have a lower ionization tendency than metal B in an electroless copper plating solution at a pH of 10 or higher, and a copper-plated thin film was formed on the alloy film by electroless plating. Table 1 shows the composition of the alloy thin film formed using the above sputtering alloy target and the thickness of the electroless copper-plated thin film formed thereon by electroless plating.

The formation of the copper film by electroless plating was carried out using a plating solution with the following composition at 50° C. for 30 to 40 seconds at pH 12.5 (regulator: potassium hydroxide). Plating solution composition Copper sulfate: 0.02 mol/L Ethylenediaminetetraacetic acid salt: 0.21 mol/L Glyoxylic acid: 0.03 mol/L 2,2'-bipyridyl: 20 mg/L Evaluations were performed for the film thickness of the resulting electroless copper-plated thin film, presence of holes 10 nm or more in diameter, resistivity, diffusion of copper into the alloy thin film, oxidation state (oxygen content) of the interface between the electroless copper-plated thin film and the alloy thin film, and the adherence of the electroless copper-plated thin film. Film thickness was confirmed by observation of cross-sections by TEM. The presence or absence of holes was confirmed by observation of the surface by SEM. Resistivity was calculated from the results of measurements of sheet resistance using a four-point probe and measurements of film thickness in the cross-sectional TEM observations. The diffusion of copper and oxidation state of the interface was determined by AES depth profile measurements. The adherence of the electroless copper-plated thin film was measured by performing a tape peeling test using cellophane tape (CT24, Nichiban Co., Ltd.) After the tape was adhered to the plated surface with the tips of the fingers, the tape was peeled off to see whether or not the copper film had detached. A finding of no peeling was scored as 0 and a finding of peeling was scored as x. Table 1 summarizes the results.

After the above sputtered alloy thin film and electroless copper thin film were formed on a semiconductor substrate with a trench pattern having a wired width of 90 nm and an aspect ratio of 4, wiring was embedded therein by electrolytic copper plating using the same as a seed layer.

Wiring was embedded by electroplating using a plating solution with the following composition for 60 seconds at 25° C. and a current density of 1 A/dm$^2$.

Copper sulfate: 0.25 mol/L

Sulfuric acid: 1.8 mol/L

Hydrochloric acid: 10 mmol/L

Trace additives: (polyethylene glycol, disodium bis(3-sulfopropyl)disulfide, Janus green)

The embedding properties of the trench structure with a wire width of 90 nm was evaluated by cross-sectional observations of the resulting copper-plated film by TEM. The presence of voids and seams was evaluated; a finding of no voids/seams was represented by 0, and a finding of voids/seams was represented by x.

Table 1 shows the results.

Examples 2 and 3, Comparative Examples 1 to 3 Alloy thin films were fabricated in the same manner as in Example 1 except that the composition of the alloy thin film in Example 1 was changed as shown in Table 1. Electroless plating was performed thereon and evaluated.

Table 1 shows the results.

TABLE 1

|  | Alloy thin film composition Metal B (at %) Metal A (at %) | Oxygen content at alloy thin film-copper plated thin film interface (at %) | Copper diffusion | Holes in copper plated thin film | Resistivity of copper plated thin film (μΩ·cm) | Thickness of copper plated thin film (nm) | Adherence of copper plated thin film | Embedding in trench structure with 90 nm wire width |
|---|---|---|---|---|---|---|---|---|
| Ex. 1 | W(80)Ni(20) | <1 | No | No | 7.3 | 7 | ○ | ○ |
| Ex. 2 | W(70)Co(30) | <1 | No | No | 6.5 | 8 | ○ | ○ |
| Ex. 3 | Mo(80)Ni(20) | <1 | No | No | 9.0 | 5 | ○ | ○ |
| Comp. Ex. 1 | W(90)Ni(10) | <1 | No | Yes | 12.3 | 11 | X | X |
| Comp. Ex. 2 | W(60)Co(40) | 2 | No | No | 15.1 | 12 | ○ | X |
| Comp. Ex. 3 | W(100) | Island-shaped depositions, uniform film of about 10 nm unattainable | | | | | | |

What is claimed is:

1. A plated product comprising a substrate having formed thereon an alloy barrier thin film for preventing copper diffusion comprising metal B, which has barrier properties in relation to copper and enables displacement plating with the copper ions contained in an electroless copper plating solution, and metal A, which tends to have less ionization than metal B in an electroless copper plating solution at a pH of 10 or higher; the alloy barrier thin film for preventing copper diffusion has a composition wherein metal A constitutes between 15 and 35 at % of atoms contained in the alloy barrier thin film; wherein metal B is tungsten or molybdenum and metal A is at least one metal selected from a group consisting of nickel, cobalt and tin; wherein the alloy barrier thin film consists of metal A and metal B; and a copper thin film is formed on the alloy barrier thin film by electroless plating using an electroless copper plating solution at a pH of 10 or higher, wherein the copper thin film formed by electroless plating has a thickness of no more than 10 nm and a resistivity of no more than 10 μΩ·cm.

2. The plated product according to claim 1, wherein the copper thin film formed by electroless plating does not have any holes of 10 nm or larger in diameter.

3. The plated product according to claim 1, wherein metal B is tungsten or molybdenum and metal A is nickel or cobalt.

4. The plated product according to claim 1, wherein metal B is tungsten and metal A is nickel or cobalt.

5. The plated product according to claim 1, wherein metal B is molybdenum and metal A is nickel.

* * * * *